United States Patent [19]

Oji et al.

[11] Patent Number: 5,451,803
[45] Date of Patent: Sep. 19, 1995

[54] SEMICONDUCTOR MEMORY DEVICE AND METHOD OF MANUFACTURING THE SAME

[75] Inventors: Hiroshi Oji; Kunio Iida, both of Kyoto, Japan

[73] Assignee: Rohm Co., Ltd., Kyoto, Japan

[21] Appl. No.: 48,004

[22] Filed: Apr. 19, 1993

[30] Foreign Application Priority Data

May 21, 1992 [JP] Japan .................... 4-128992

[51] Int. Cl.⁶ .................... H01L 29/68; H01L 29/78
[52] U.S. Cl. .................... 257/316; 257/321; 365/185
[58] Field of Search ............... 257/314, 316, 315, 321, 257/322; 365/185, 213

[56] References Cited

U.S. PATENT DOCUMENTS

| | | | |
|---|---|---|---|
| 5,159,431 | 10/1992 | Yoshikawa | 257/316 |
| 5,229,632 | 7/1993 | Yoshikawa | 257/320 |
| 5,270,240 | 12/1993 | Lee | 437/52 |
| 5,280,446 | 1/1994 | Ma et al. | 365/185 |
| 5,282,160 | 1/1994 | Yamagata | 365/185 |

*Primary Examiner*—Jerome Jackson
*Assistant Examiner*—Donald L. Monin, Jr.
*Attorney, Agent, or Firm*—Steven M. Rabin

[57] ABSTRACT

A semiconductor memory device in which source lines for connecting source regions of memory cells disposed in a direction of word lines are composed of conductive films formed on a semiconductor substrate. Gate assemblies including components such as the word lines are formed on the semiconductor substrate. Source regions are formed in self-alignment by using the gate assemblies as masks. Source contact holes are formed above the source regions, and the source lines are in contact with the source regions in the source contact holes. The source lines are composed of conductive films formed on the semiconductor substrate between the adjacent word lines on opposite sides of any of the source regions.

8 Claims, 10 Drawing Sheets

SEMICONDUCTOR MEMORY DEVICE AND METHOD OF MANUFACTURING THE SAME

BACKGROUND OF THE INVENTION

1. Field of the Invention

The present invention relates to a semiconductor memory device such as a flash-type EEPROM (Electrically Erasable/Programmable Read Only Memory) and a method of manufacturing the same.

2. Description of the Related Art

A flash-type EEPROM conventionally used is configured as shown in FIGS. 14, 15, 16 and 17. FIG. 14 is a schematic plan view of the flash-type EEPROM, and FIGS. 15, 16 and 17 are sectional views taken along the lines XV—XV, XVI—XVI, and XVII—XVII of FIG. 14.

$N^+$-type drain diffusion regions 1 and $N^+$-type source diffusion regions 2 are formed in a P-type semiconductor substrate 10 with channel regions 3 defined between the diffusion regions 1 and 2. A floating gate 5 in an electrically floating state is formed on each of the channel regions 3 with a tunnel oxide film 4 interposed between them. A control gate 8 acting as a word line is superposed over the floating gate 5 with an insulating film 6 sandwiched between them. Either of the floating gate 5 and the control gate 8 is made of, for example, polycrystalline silicon film. Reference numeral 7 denotes low concentration impurity diffusion layers used for enhancing sustainable voltage of the source diffusion regions 1.

A layer insulating film 9 is formed over a surface of the substrate 10 on which the above-mentioned various components such as the control gate 8 are formed. Contact holes 11 are formed above the drain diffusion regions 1 in the layer insulating film 9. On a surface of the layer insulating film 9, aluminum wirings 12 serving as bit lines are formed in contact with the drain diffusion regions 1 in the contact hole 11. Reference numeral 13 designates field oxide films for isolating cells from one another.

Each drain diffusion region 1 and each source diffusion region 2 are shared with adjacent memory cells. The source diffusion regions 2 disposed along word lines (control gates 8) are interconnected by source lines 14. The source lines 14 are formed in the substrate 10 by impurity diffusion simultaneous with forming the source diffusion regions 2.

When writing voltage at a positive high level (e.g., 12 V) is applied to the control gate 8 and also positive high voltage (e.g., 7 V) is applied to the drain diffusion region 1, electrons are accelerated from the source diffusion region 2 toward the drain diffusion region 1. Simultaneously, a strong electric field caused in the boundary of each drain diffusion region 1 produces hot electrons, which pass through the tunnel oxide film 4 and are injected into the floating gate 5. In this way, writing is effected. When high voltage reverse in polarity to the voltage in the writing is applied between the control gate 8 and the substrate 10, electrons are pulled out of the floating gate 5. In this way, erasing is effected.

A threshold level of the voltage to be applied to the control gate 8 in order to electrically connect a source and a drain, takes two different values depending upon whether the electrons exist in the floating gate 5. Sense voltage which has an intermediate level between the two different threshold levels is applied and then connection/disconnection between the source and the drain is checked, and thus, reading information can be effected.

Because of the electrically floating state of the floating gate 5, the quantity of electric charge injected therein is not varied unless the writing voltage or the erasing voltage is applied thereto, and therefore, storing data can be effected in a non-volatile manner.

Such a flash-type EEPROM is made in a manner as described below. A field oxide film 13 is formed on a surface of the substrate 10 by a LOCOS (LOCal Oxidation of Silicon) method, and then, the tunnel oxide film 4 is formed over the entire surface of the substrate 10. In this situation, the floating gate 5 is formed by depositing polycrystalline silicon, adding phosphorus as impurity to gain conductivity, and then patterning it.

Then, the insulating film 6 is formed, and after deposition of polycrystalline silicon, addition of phosphorus, and patterning, the control gates 8 acting as word lines is formed. The source diffusion regions 2 and the source lines 14 are to be formed later by implanting ions in regions between the field oxide films 13. For that purpose, some components such as the control gates 8 must be formed in position without protruding into an area between the field oxide films 13. Hence, allowing for an accuracy of mask alignment and other factors, the components such as the control gates 8 are formed in positions a distance $\Delta L$ receding from edges of the field oxide films 13, as shown in FIG. 17. If the control gates 8 are formed in a position protruding from the edges of the field oxide films 13, each of the source lines 14 is reduced in width to have an insufficient cross-sectional area, and this may cause a high resistance therein.

After the control gates 8 are formed, phosphorus ions are implanted to form the low concentration diffusion layers 7 surrounding the source diffusion regions 2. Then, arsenic ions are implanted with masks of the field oxide films 13 and the control gates 8, and thereby the $N^+$-type source diffusion regions 2, the $N^+$-type drain diffusion regions 1 and the source lines 14 are formed.

Then, the substrate 10 is covered with the layer insulating film 9, and the contact holes 11 are formed. After that, the aluminum wiring 12 acting as bit lines are formed and patterned.

In the above-mentioned flash-type EEPROM, however, degree of integration therein is restricted, and hence, there arises a disadvantage that miniaturization of the whole memory device is difficult. More specifically, the field oxide films 13 are used to isolate elements from each other in the abovementioned flash-type EEPROM. Hence, it is necessary to make the oxide films extend to a level deep enough from the surface of the substrate to perfectly isolate the elements, and this is why the oxide films 13 must be made thick. With the oxide films thickened, their width along the surface of the substrate 10 is necessarily increased, and naturally, a distance L1 between the bit lines (see FIG. 14) becomes large to some extent. This prevents an enhancement of integration in the memory device.

Moreover, as described above, since the source diffusion regions 2 and the source lines 14 are formed by ion implantation after the word lines (control gates 8) are formed, the word lines must be formed in positions receding from the edges of the field oxide films 13. In other words, in a configuration where the source lines 14 formed by the ion implantation extend in the semiconductor substrate 10 between the adjacent word lines (control gates 8), reduction of a distance L2 between the word lines is restricted. This also prevents an enhancement of integration in the memory device.

In addition to that, in a process of manufacturing the above flash-type EEPROM, although both the floating gate 5 and the control gate 8 are formed of polycrystalline silicon film, they are patterned individually. Hence, there arises another disadvantage that the manufacturing process is complicated.

SUMMARY OF THE INVENTION

An object of the present invention is to provide a semiconductor memory device which can be adapted to enhance integration therein and naturally advantageous in miniaturization.

Another object of the present invention is to provide a method of manufacturing a semiconductor memory device which is advantageous in enhancing integration in it and miniaturizing it.

Still another object of the present invention is to provide a method of manufacturing a semiconductor memory device according to which its manufacturing process can be simplified.

Yet another object of the present invention is to provide a semiconductor devices which can be adapted to enhance integration in it and miniaturize it.

A further object of the present invention is to provide a method of manufacturing a semiconductor device which is advantageous in enhancing integration in it and miniaturizing it.

Further another object of the present invention is to provide a method of manufacturing a semiconductor device according to which a manufacturing process can be simplified.

A semiconductor memory device according to the present invention includes a plurality of memory cells arranged in a matrix manner on a semiconductor substrate. The memory cells have their respective source regions, drain regions, and channel regions interposed between the source and drain regions, and any of the source regions is shared with a pair of the memory cells adjacent to each other in a specified direction. The semiconductor memory device includes word lines along the memory cells aligned in one direction, and bit lines connected to the drain regions of the memory cells disposed in a direction intersecting to the word lines. The source regions are formed in regions between the word lines adjacent to each other in the semiconductor substrate. Source lines are provided connecting the source regions of the memory cells disposed along the word lines. The source lines are formed of conductive films patterned on the semiconductor substrate.

In the above-mentioned configuration, the source regions are formed in the semiconductor substrate between the adjacent word lines, and therefore, a distance between these word lines on opposite sides of any of the source regions must have minimum value equivalent to required width for the source regions. However, the source lines interconnecting the source regions of a plurality of cells disposed along the word lines are not formed in the semiconductor substrate. The source lines are formed of conductive films made on the semiconductor substrate. Hence, the source lines can be of sufficiently low resistance independent of positions where the word lines are formed. Accordingly, unlike the prior art, reduction of a distance between the word lines is not restricted to keep the required width of the source lines, but the reduction of the distance between the word lines is restricted only by the width required for the source regions. Thus, the distance between the word lines on opposite sides of any source region can be minimized. Eventually, this enables an enhancement of integration in the memory device and accordingly miniaturization of the device.

Components like the source regions can be formed in self-alignment by implanting ions with the word lines and the like being used as masks. Keeping the distance between the word lines on opposite sides of any source region equivalent to the minimum width required for the source regions, required device characteristics can be obtained, and additionally, the distance between the word lines can be minimized.

These and other objects, features and advantages of the present invention will become more apparent from the following detailed description of the preferred embodiments when taken in conjunction with the accompanying drawings.

DESCRIPTION OF PREFERRED EMBODIMENTS

Figure 1:
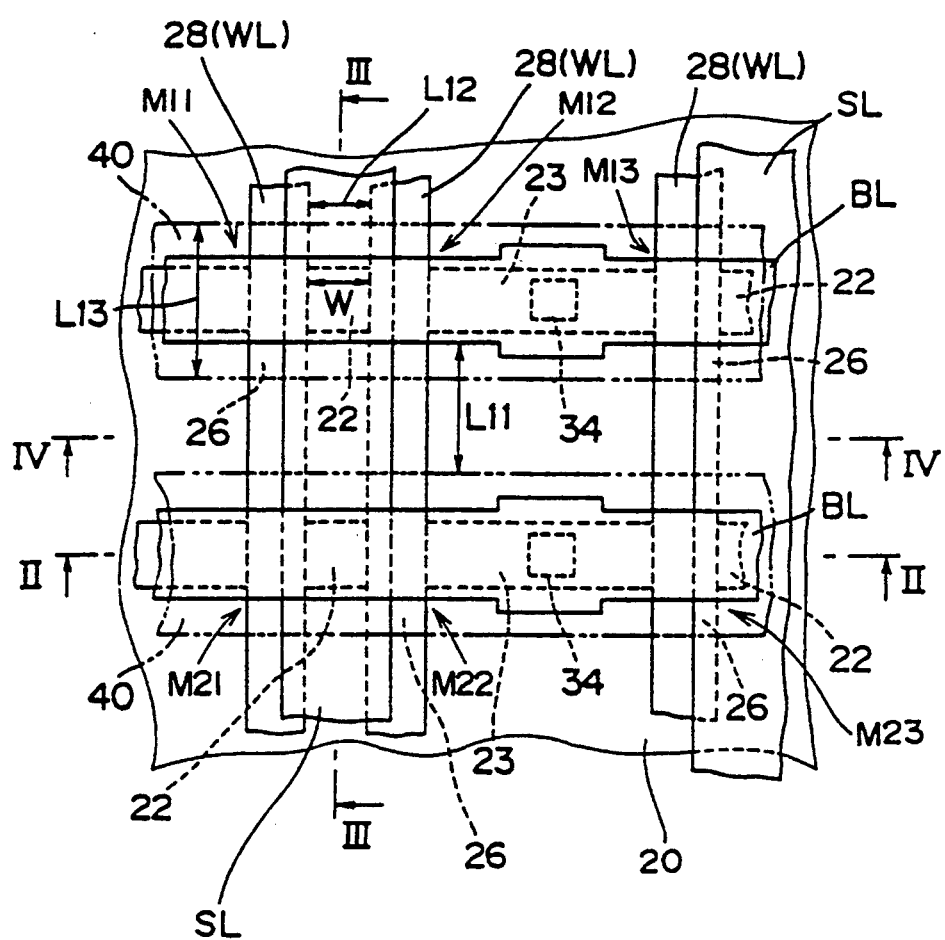
FIG. 1 is a schematic plan view showing a structure of a flash-type EEPROM of a semiconductor memory device of a preferred embodiment according to the present invention.
Figure 2:
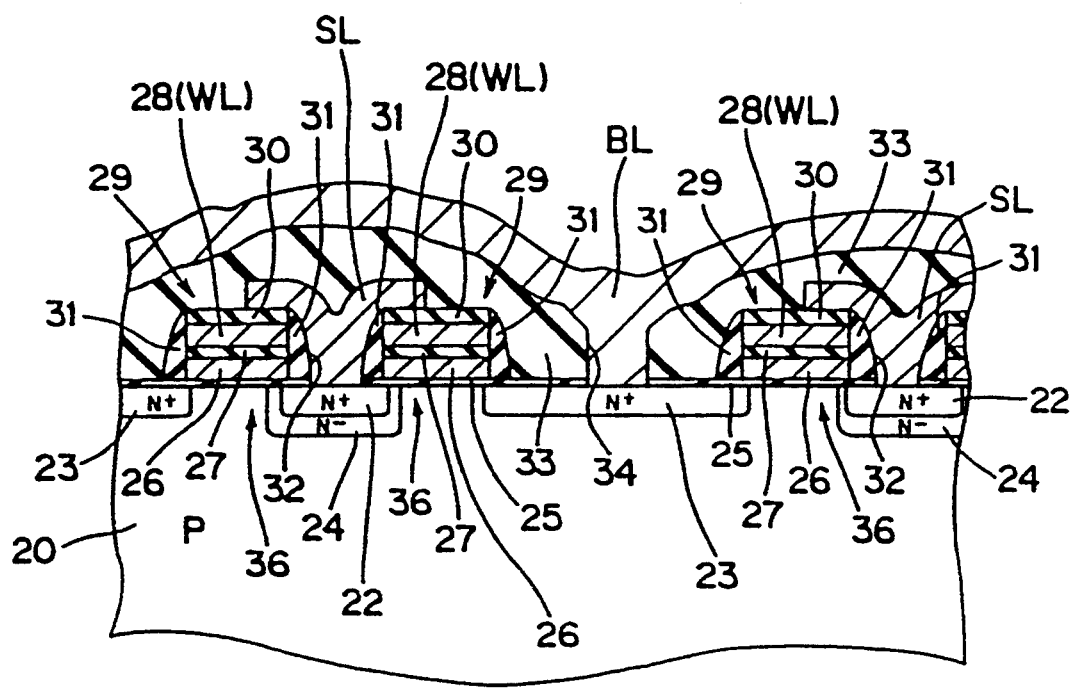
FIG. 2 is a sectional view taken along the line II—II of FIG. 1.
Figure 3:
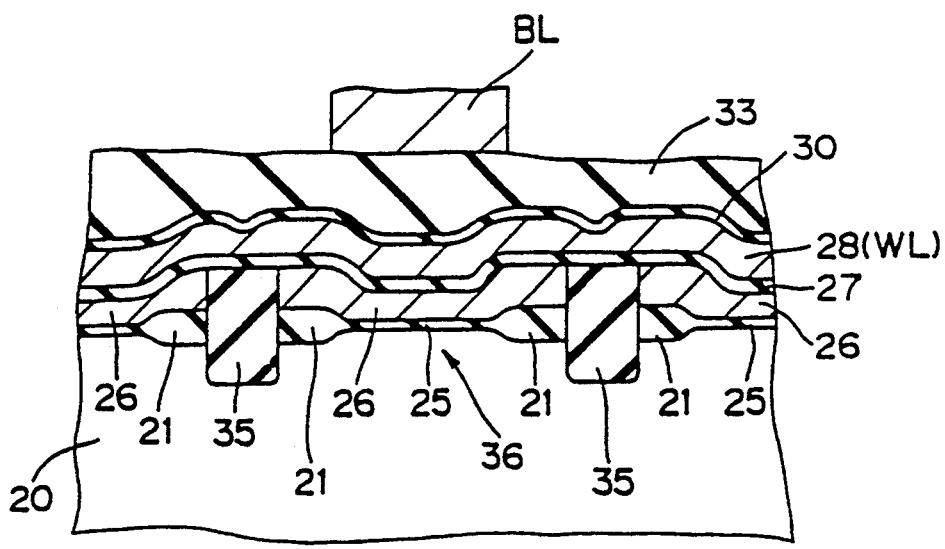
FIG. 3 is a sectional view taken along the line III—III of FIG. 1.
Figure 4:
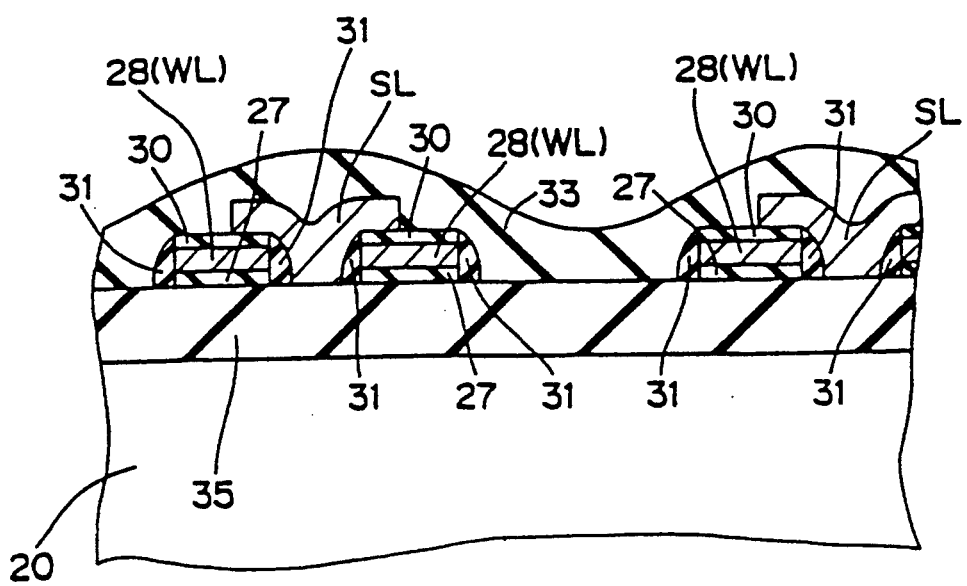
FIG. 4 is a sectional view taken along the line IV—IV of FIG. 1.

FIG. 1 is a schematic plan view partially showing a structure of a flash-type EEPROM of a semiconductor memory device of a preferred embodiment according to the present invention, and FIGS. 2, 3 and 4 are sectional views taken along the lines II—II, III—III and IV—IV of FIG. 1, respectively.

The flash-type EEPROM includes a plurality of memory cells M11, M12, M13, M21, M22 and M23 (hereinafter referred to as "memory cells M" en bloc), arranged in a matrix manner on a P-type semiconductor substrate 20. While there are shown six of the memory cells M in FIG. 1, approximately 1000000 memory cells M are provided on the semiconductor substrate 20 in practice.

Each of the memory cells M is formed in one of element formation regions electrically isolated from each other by field oxide films 21 (not shown in FIG. 1). Each of the memory cells M has an N+-type source diffusion region 22 (referred to as "source region(s) 22" hereinafter) and an N+-type drain diffusion region 23 (referred to as "drain region(s) 23" hereinafter), both of which are made by impurity diffusion. A low concentration impurity diffusion layer 24 is formed surrounding the source region 22. This is helpful to make gradation of impurity concentration from the P-type semiconductor substrate 20 to the source region 22, and eventually, application of a strong electric field to the boundary of the source region 22 is prevented. The vicinity of the source region 22 structurally has enhanced voltage sustainability. The source region 22 is shared with a pair of the memory cells M laterally adjacent to each other in FIG. 1.

A tunnel oxide film 25 composed of silicon oxide film or the like is formed on a surface of the semiconductor substrate 20. The source regions 22 and the drain regions 23 define channel regions 36 between them. In regions above the channel regions 36, floating gates 26 serves as electrode films are formed on the tunnel oxide films 25 in an electrically floating state. Insulating layers 27 are laminated on the floating gates 26, and control gates 28 are further formed extending in a specified direction on the insulating layers 27. The control gates 28 function as word lines WL for controlling the memory cells M aligned in a specified direction. On the control gates 28, insulating layers 30 made of silicon oxide film or the like are further formed.

Both of the floating gates 26 and the control gates 28 are formed of polycrystalline silicon film of low resistance caused by adding phosphorus. Each of the insulating layers 27 is configured in the so-called ONO (Oxide-Nitride-Oxide) film where a silicon nitride film is sandwiched between a pair of oxide silicon films.

Side walls 31 made of silicon oxide film or the like are attached to sides of gate assemblies 29 each consisting of the floating gate 26, the insulating layer 27, the control gate 28 and the insulating layer 30. Source lines SL which commonly connect a plurality of source regions 22 disposed in a direction along the word lines WL are formed in contact with the source regions 22 between two of the word lines WL on opposite sides of the source region 22 on the semiconductor substrate 20. The source lines SL are buried in source contact holes 32 formed in self-alignment between the side walls 31. The source lines SL are made of polycrystalline silicon film of low resistance caused by adding phosphorus.

Moreover, a layer insulating film 33 is formed covering the entire surface of the substrate, and drain contact holes 34 are formed through the layer insulating film 33 and the tunnel oxide film 25 to expose the drain region 23. Then, bit lines BL extending in a direction intersecting to the word lines WL are made in contact with the drain regions 23 through the drain contact holes 34. The bit lines BL are formed by depositing, for example, aluminum in a layer and then patterning it.

The field oxide films 21 for isolating elements from each other are formed thinner than prior art embodiments (e.g., 4000 Å in thickness) to shorten a distance L11 between the bit lines BL. Oxide film buried layers 35 are provided in the middle position of the field oxide films 21 with respect to a direction along the word lines WL, extending to a level deep enough in the semiconductor substrate 20 (e.g., 10000 Å deeper than the bottoms of the field oxide films 21).

According to the above described construction, isolation of the elements from each other can be assuredly performed by a function of the oxide film buried layers 35, even when the field oxide films 21 must be made thin to shorten the distance L11 between the bit lines BL. In other words, the elements can be assuredly isolated from each other while the distance L11 between the bit lines BL can be shortened.

On the other hand, in this embodiment, the source regions 22 do not extend along the word lines WL but are formed only in part where the memory cells are to be configured under the bit lines BL. The source regions 22 arranged along the word lines WL are interconnected by the source lines SL formed of polycrystalline silicon film on the semiconductor substrate 20.

Even with a width W of the source regions 22 shortened, the source lines SL could be adopted to have a sufficiently large cross-sectional area so that they may be of low resistance. Hence, while the width W is shortened, the distance L12 between the word lines WL can be reduced. It is desirable that the source regions 22 are formed in self-alignment by ion implantation with the gate assemblies 29 being used as masks. In such a case, reduction of the distance L12 between the word lines WL are restricted only by the width W required for each source region 22. Unlike a structure of a prior art embodiment, no such a restriction that the word lines must be formed in positions receding from edges of the field oxide films by a distance which is determined with due regard to accuracy of mask alignment is imposed.

In the flash-type EEPROM in this embodiment, either the distance L12 between the word lines WL or the distance L11 between the bit lines BL can be reduced. This enables enhanced integration, and therefore, the whole flash-type EEPROM device can be considerably miniaturized.

The flash-type EEPROM operates as in the following manner, for example. In writing information, the source lines SL are set at a ground potential, positive high voltage (e.g., 12 V) is applied to the control gate 28 while positive high voltage (e.g., 7 V) is applied to the bit line BL. In this way, electrons are accelerated from the source region 22 to the drain region 23, and a strong electric field caused in the boundary of the drain region 23 causes hot electrons to be produced. The hot electrons pass through the tunnel oxide film 25 and then are injected to the floating gate 26. Thus, the writing of information is effected.

In erasing information, for example, the source line SL are set to 12 V while the control gate 28 is at 0 V.

This allows high voltage to be applied between a source and a gate, and electrons accumulated in the floating gate 26 tunnel and then are pulled into the source region 22. Thus, the erasing of information is effected.

A threshold voltage to be applied to the control gate 28 in order to electrically connect between the source and the drain varies in level from the writing state at which electrons are injected in the floating gate 26 to the erasing state at which the electrons are pulled out of it. Thus, reading information is effected by applying a sense voltage at a intermediate level between the two different threshold levels to the control gate 28 and monitoring if the source and the drain are electrically connected.

A method of manufacturing the flash-type EEPROM as stated above will now be described with reference to FIGS. 5 to 13. FIGS. 5 to 13 each illustrating process steps include sectional views (a), (b) and (c), respectively. The sectional views (a), (b) and (c) are diagrams taken along the cross-sectional planes similar to FIGS. 2, 3 and 4, respectively.

Figure 5A:
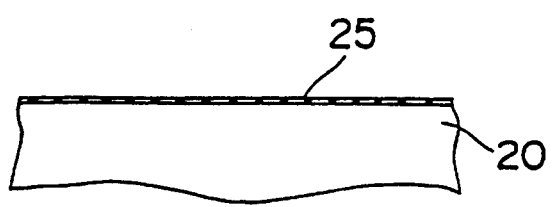
FIGS. 5(a), 5(b) and 5(c) are sectional views showing a step of a process of manufacturing a flash-type EEPROM of the above preferred embodiment.
Figure 5C:
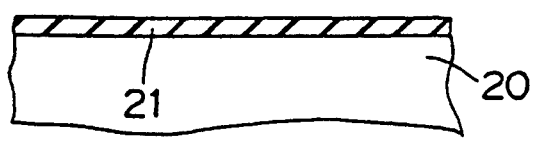
Figure 5B:
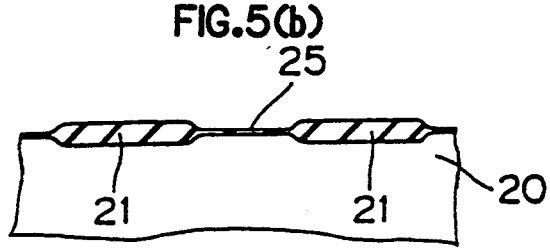

First, as shown in FIGS. 5(a), 5(b) and 5(c), the field oxide films 21 are formed on the surface of the semiconductor substrate 20 by the LOCOS method. Next, boron ions (the quantity of, for example, about $5 \times 10^{12}/cm^3$) are implanted to set an ion concentration in the channel region at a specified value. After that, the tunnel oxide film 25 (100 Å in thickness) acting as a second insulating film is formed covering the whole surface of the substrate 20. The field oxide films 21 are shaped in belts extending in regions between the bit lines BL.

Figure 6A:
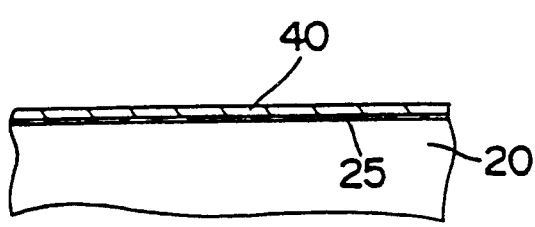
FIGS. 6(a), 6(b) and 6(c) are sectional views showing a next step of the process shown in FIGS. 5(a), 5(b) and 5(c)
Figure 6C:
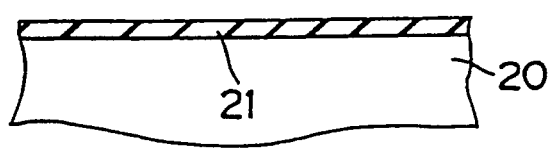
Figure 6B:
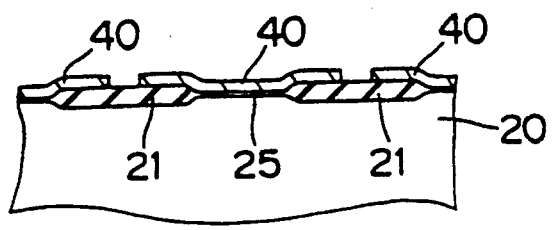

Then, a polycrystalline silicon film is formed over the entire surface of the substrate 20 and then patterned after phosphorus is added so that the film is of low resistance; and eventually, as shown in FIGS. 6(a), 6(b) and 6(c), a polycrystalline silicon film 40 (e.g., 1500 Å in thickness) used for forming the floating gates 26 is patterned into belts (illustrated by two-dot-dash line in FIG. 1). Thus, the belt-shaped polycrystalline silicon films 40 are patterned extending along the bit lines BL with a width identical to a length L13 of the floating gates 26 along the direction of the word lines WL.

Figure 7A:
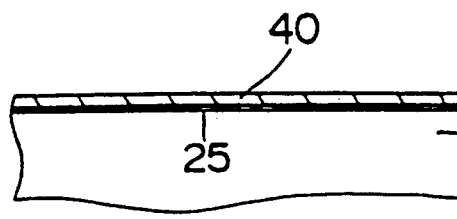
FIGS. 7(a), 7(b) and 7(c) are sectional views showing a next step of the process shown in FIGS. 6(a), 6(b) and 6(c)
Figure 7C:
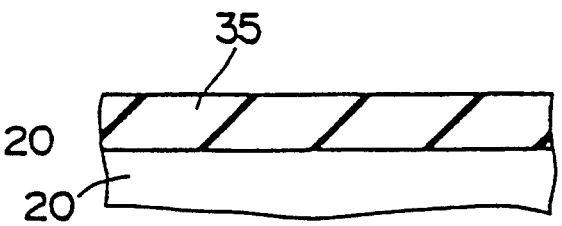
Figure 7B:
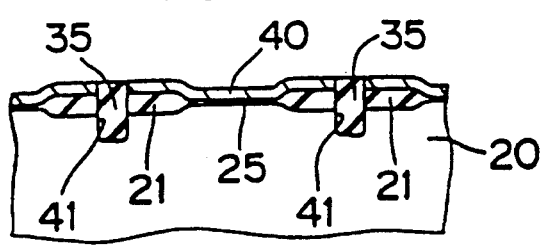

Then, as shown in FIGS. 7(a), 7(b) and 7(c), the field oxide films 21 are etched with masks of the band-shaped polycrystalline silicon films 40, and the semiconductor substrate 20 deeper than the field oxide films 21 is etched. The etching is conducted by means of dry etching. In this way, grooves 41 are formed in self-alignment in the middle portion between the bit lines BL, extending up to a level deep enough in the semiconductor substrate 20. In this situation, an oxide film is deposited over the entire surface of the substrate 20, and the oxide film is etched back by means of dry etching until the polycrystalline silicon film 40 is exposed so as to obtain a configuration where the oxide film buried layers 35 are provided in the grooves 41, as shown in FIGS. 7(a), 7(b) and 7(c).

Figure 8A:
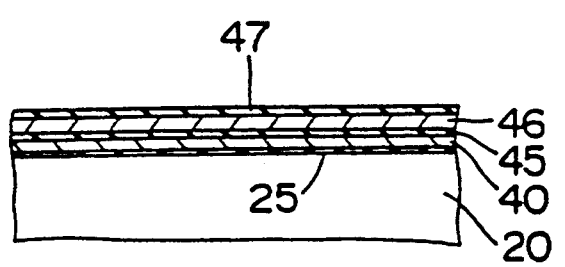
FIGS. 8(a), 8(b) and 8(c) are sectional views showing a next step of the process shown in FIGS. 7(a), 7(b) and 7(c)
Figure 8C:
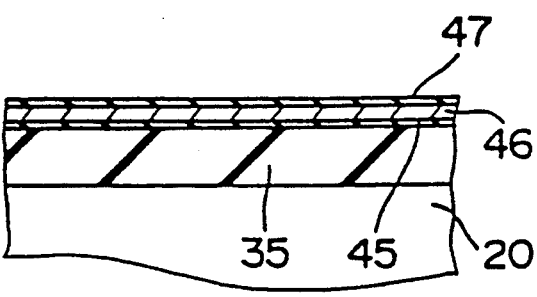
Figure 8B:
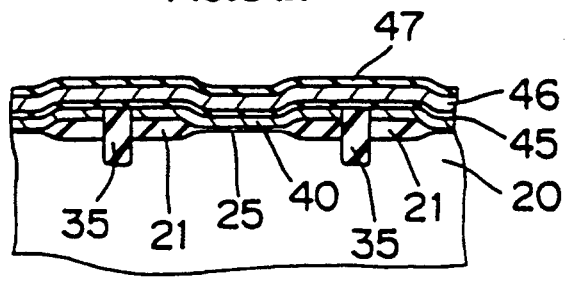

In this situation, as shown in FIGS. 8(a), 8(b) and 8(c), the films which together constitute the gate assembly 29 are formed. More specifically, an insulating film 45 corresponding to the third insulating film to be the insulating layers 27, a polycrystalline silicon film 46 to be the control gates 28, and an insulating film 47 to be the insulating layers 30 are superposed in this order into a lamination. After forming the polycrystalline silicone film 46, phosphorus is added to it so that it may be of low resistance. A thickness of each film is determined as follows:

| Insulating film 45 | 300Å |
| Polycrystalline silicon film 46 | 3500Å |
| Insulating film 47 | 1000Å |

Figure 9A:
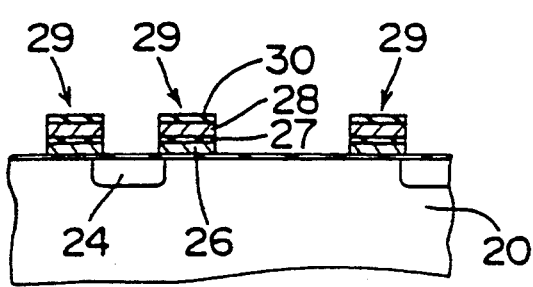
FIGS. 9(a), 9(b) and 9(c) are sectional views showing a next step of the process shown in FIGS. 8(a), 8(b) and 8(c)
Figure 9C:
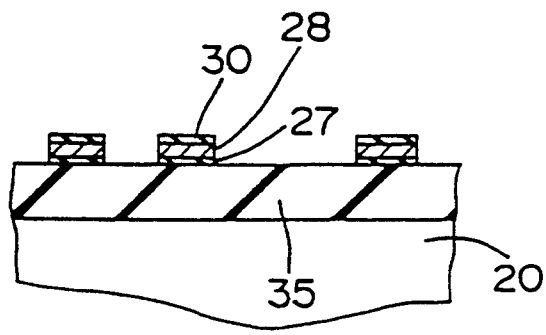
Figure 9B:
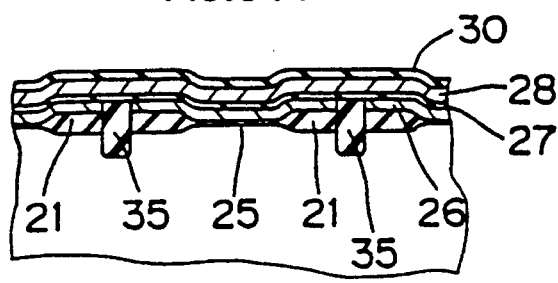

Then, as shown in FIGS. 9(a), 9(b) and 9(c), the gate assemblies 29 are patterned. Specifically, the insulating film 45, the polycrystalline silicon film 46 and the insulating film 47 are etched so as to make belt-shaped patterns corresponding to the word lines WL. The etching is conducted by dry etching.

Simultaneously, the lower polycrystalline silicon films 40 are etched away from regions between the word lines WL, and consequently, the floating gates 26 perfectly aligned with the control gates 28 are formed.

Subsequent to the patterning of the gate assemblies 29, phosphorus ions are implanted with masks of the gate assemblies 29 to form the diffusion layers 24 (the quantity of the implanted ions is about $1 \times 10^{14}/cm^3$).

Figure 10A:
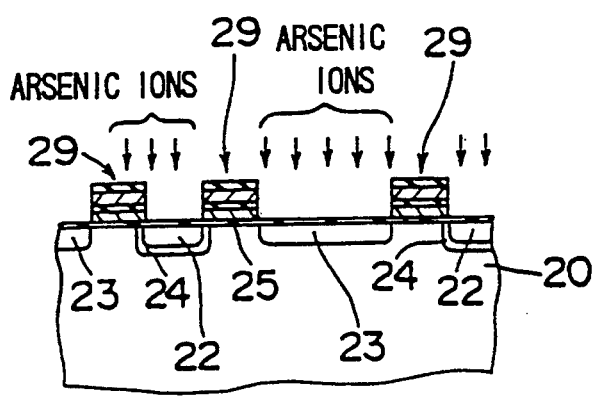
FIGS. 10(a), 10(b) and 10(c) are sectional views showing a next step of the process shown in FIGS. 9(a), 9(b) and 9(c)
Figure 10C:
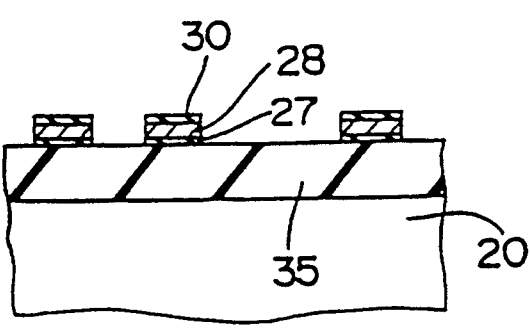
Figure 10B:
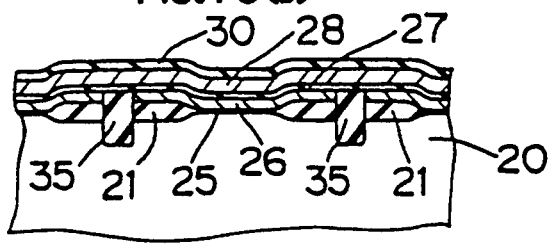

Furthermore, as shown in FIGS. 10(i a), 10(b) and 10(c), arsenic ions are implanted with the masks of the gate assemblies 29 (the quantity of the implanted ions is about $5 \times 10^{15}/cm^3$), and as a result of thermal diffusion of the implanted ions, the N$^+$-type source diffusion regions 22 and the N$^+$-type drain diffusion regions 23 are formed.

Figure 11A:
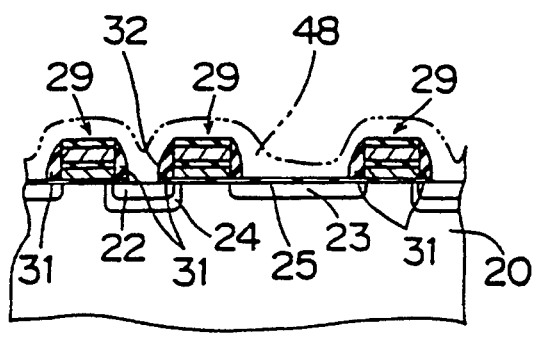
FIGS. 11(a), 11(b) and 11(c) are sectional views showing a next step of the process shown in FIGS. 10(a), 10(b) and 10(c)
Figure 11C:
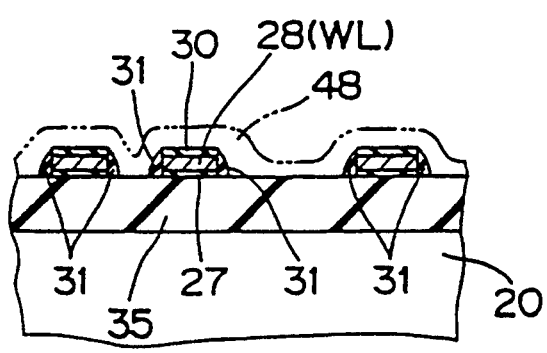
Figure 11B:
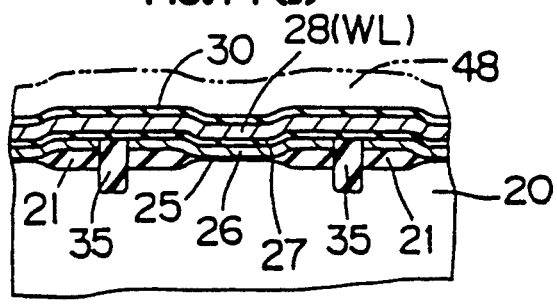

The subsequent step is shown in FIGS. 11(a), 11(b) and 11(c). In this step, a thick oxide film 48 shown by two-dot-dash line (e.g., 3000 Å in thickness) is formed covering the entire surface of the substrate 20. The oxide film 48 is corresponding to a first insulating film. The thick oxide film 48 is etched back by dry etching till the tunnel insulating film 25 is exposed. As a result, the side walls 31 are formed fitting on sides of each of the gate assemblies 29.

Also, simultaneously the tunnel insulating film 25 is etched to form the source contact holes 32 in self-alignment.

Figure 12A:
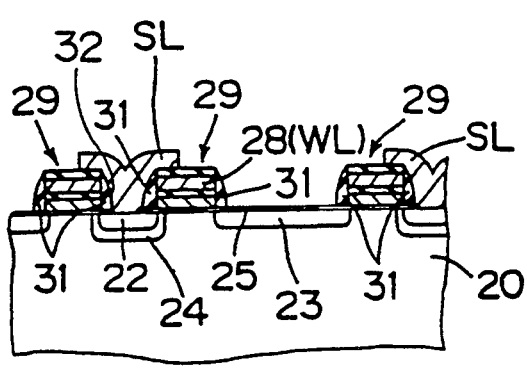
FIGS. 12(a), 12(b) and 12(c) are sectional views showing a next step of the process shown in FIGS. 11(a), 11(b) and 11(c)
Figure 12C:
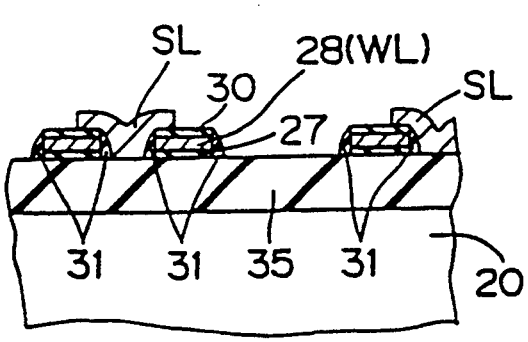
Figure 12B:
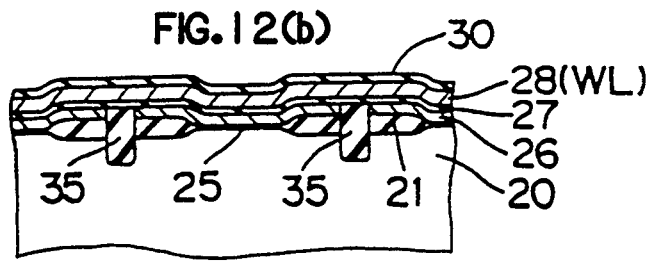

Then, as shown in FIGS. 12(a), 12(b) and 12(c), the source lines SL, which act as first conductive films in contact with the source regions 22 in the source contact holes 32, are patterned so as to extend along the word lines WL. The source lines SL are formed of polycrystalline silicon film to which phosphorus ions are added. Formation of the source lines SL is performed by CVD method, and its thickness is, for example, 2500 Å. After the formation of the source lines SL, annealing is performed (e.g., at 900° C. for 30 minutes), and the source lines SL and the source regions 22 are joined.

Figure 13A:
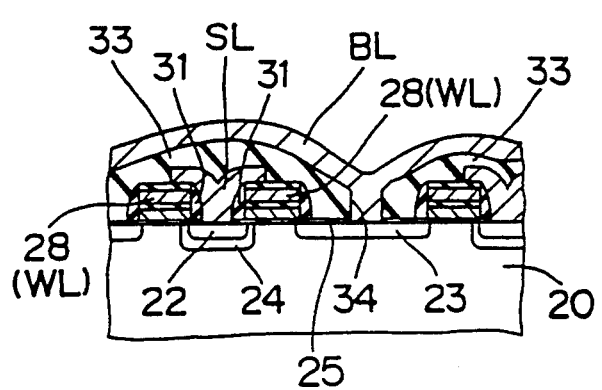
FIGS. 13(a), 13(b) and 13(c) are sectional views showing a next step of the process shown in FIGS. 12(a), 12(b) and 12(c)
Figure 13C:
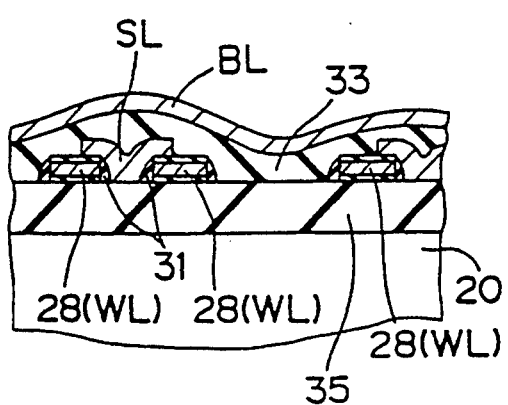
Figure 13B:
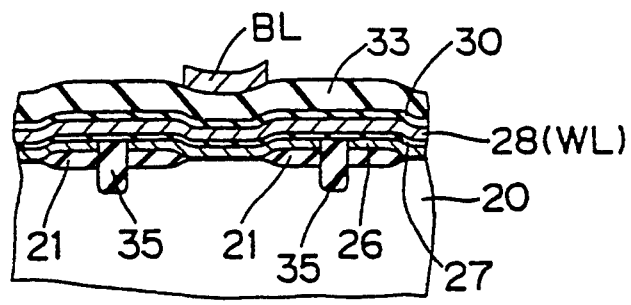
Figure 14:
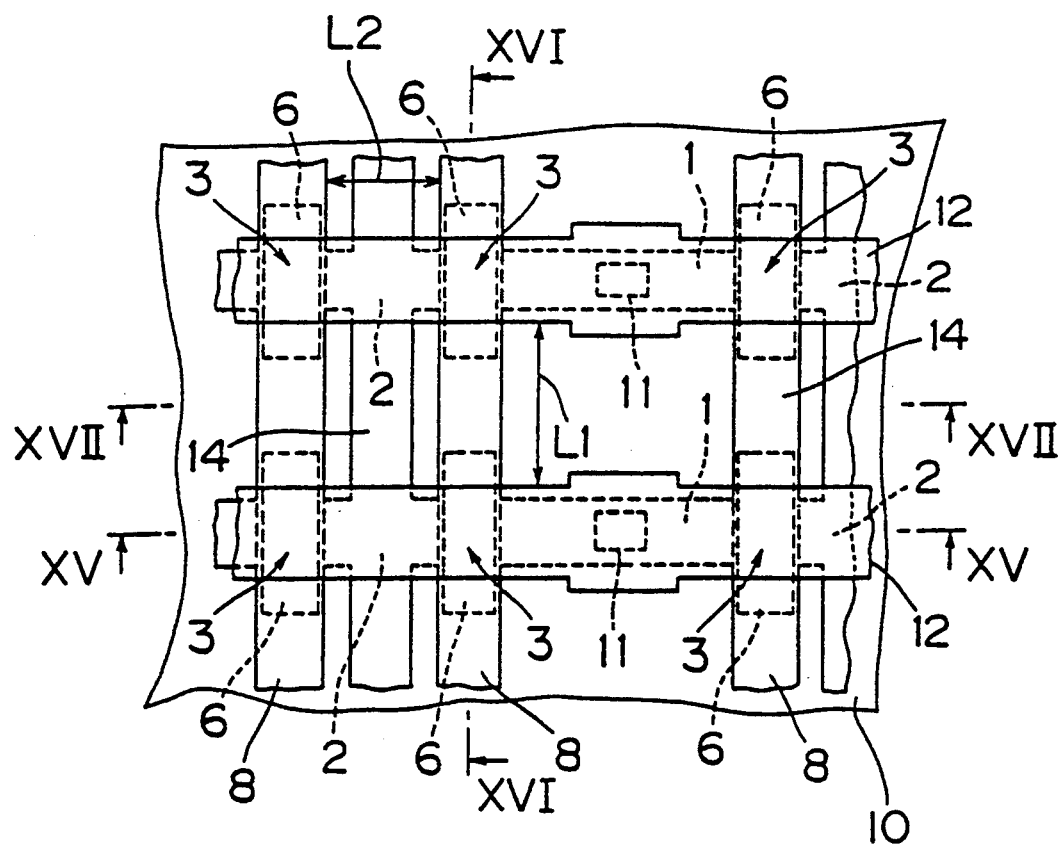
FIG. 14 is a plan view showing a structure of a prior art flash-type EEPROM.
Figure 15:
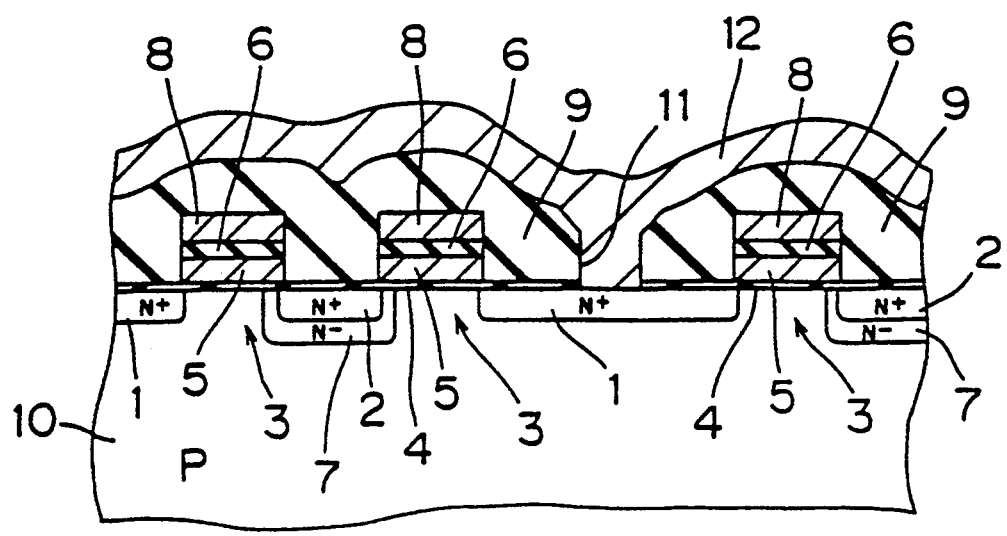
FIG. 15 is a sectional view taken along the line XV—XV of FIG. 14.
Figure 16:
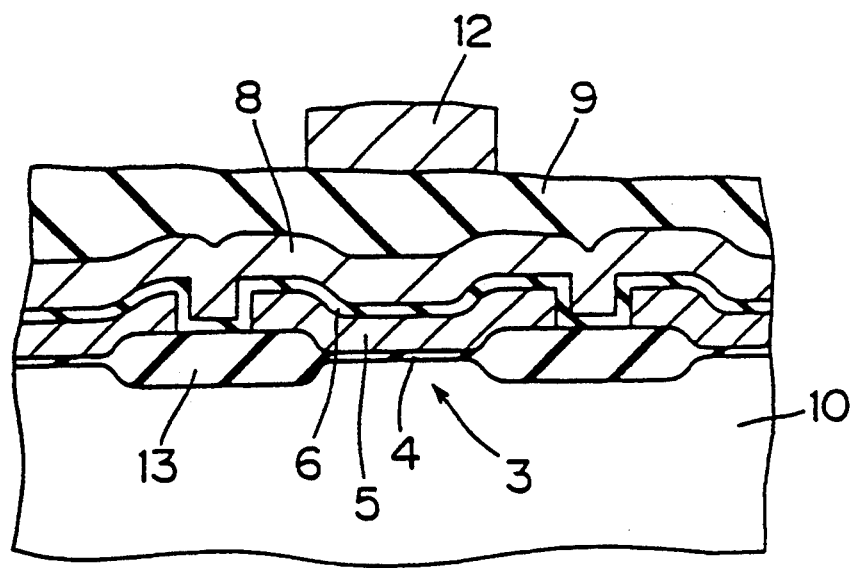
FIG. 16 is a sectional view taken along the line XVI—XVI of FIG. 14.
Figure 17:
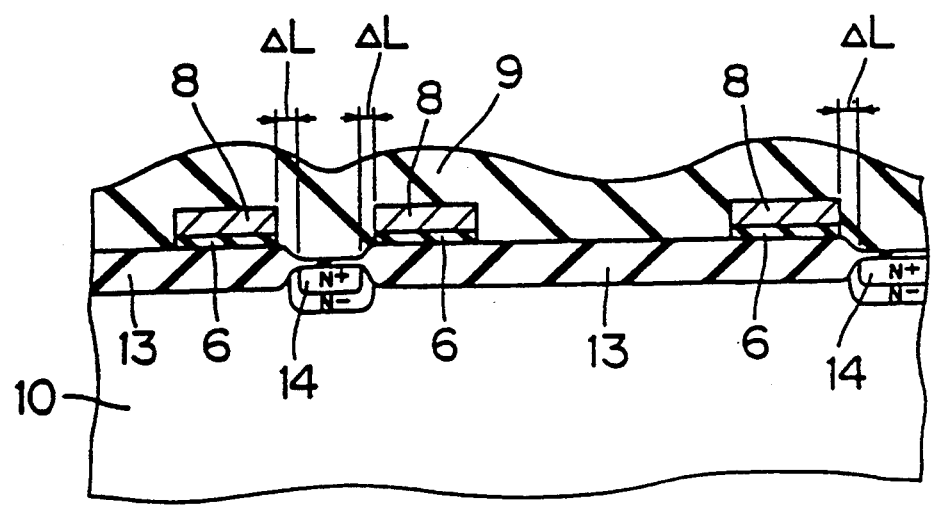
FIG. 17 is a sectional view taken along the line XVII—XVII of FIG. 14.

In this situation, as shown in FIGS. 13(a), 13(b) and 13(c), the layer insulating film 33 is formed covering the entire surface of the substrate, and the drain contact holes 34 penetrating through the layer insulating film 33 and the tunnel insulating film 25 are formed above the drain regions 23. Then, the bit lines BL extending in a direction intersecting to the word lines WL are formed in contact with the drain regions 23 in the drain contact holes 34. The bit lines BL are formed by, for example, depositing aluminum to form aluminum thin film on the entire surface of the substrate by means of spattering and patterning the aluminum thin films in belt shape.

According to the above-mentioned manufacturing method, the field oxide films 21 for isolating elements from each other are shaped into belts, and the source regions 22 are placed in any position between the belt-shaped field oxide films 21. In the prior art embodiment, rectangular field oxide films are formed in specified positions on a substrate, and impurity is diffused in other regions provided with none of those films. Intersections of the regions in which no field oxide film is formed are defined as source regions, and diffusion regions connecting the source regions to each other are used as source lines. Thus, the source regions are definitely positioned in the intersections of the regions where no field oxide films are formed, and therefore, there arises the problem that positional alignment of the word lines with the field oxide films requires precise control. In this embodiment, the problem can be perfectly overcome.

On the other hand, in the prior art, it is necessary to prevent the word lines from being formed protruding into the regions where the field oxide films are not formed, so that the source lines formed of diffusion regions having a specified width can be assuredly formed. This is why the word lines must be formed in positions receding from edges of the field oxide films by a distance which is determined with due regard to accuracy of mask alignment.

According to the manufacturing method of this embodiment, however, the source lines SL are formed on the substrate after the word lines WL are formed, and therefore, the source lines SL can be formed, each having a sufficiently large cross-sectional area and being of low resistance, independent of positions where the word lines are formed. Hence, a distance between the adjacent word lines on opposite sides of any of the source regions 22 can be shortened; that is, the distance L12 between the word lines WL on opposite sides of any of the source regions 22 can be reduced to a minimum width $W_{min}$ required for the source regions 22. If the distance L12 between the word lines WL is reduced to the minimum width $W_{min}$, the source regions 22 are formed in self-alignment with the masks of the word lines WL, and hence, the source regions 22 can have the required minimum width $W_{min}$ without exception.

Moreover, in this embodiment, since the floating gates 26 are patterned simultaneous by with the patterning of the control gates 28, as discussed above, the floating gates 26 can be assuredly aligned with the control gates 28. Thus, there is no need of allowing for a margin for mask alignment between positions where the control gates 28 are formed and positions where the floating gates 26 are formed, and eventually, it is possible to enhance integration in the memory device. Additionally, since the floating gates 26 and the control gates 28 are simultaneously patterned, a manufacturing process can be advantageously simplified.

While preferred embodiments of the present invention have been described, the present invention is not restricted to those embodiments. The above-mentioned preferred embodiments have been described in conjunction with a flash-type EEPROM using a floating gate, but the present invention can be easily applied to a flash-type EEPROM which employs an insulating film for trapping electric charge. Also the present invention can be applied to a volatile memory device as well as a non-volatile memory device. Thus, the present invention can be widely applied to semiconductor memory devices where source regions of memory cells adjacent to each other along word lines must be interconnected. Part of the present invention, which relates to separation of element formation regions by field oxide films and oxide film buried layers, can also be applied to semiconductor devices other than the memory devices.

Although the present invention has been described in terms of the preferred embodiments disclosed above, it should be understood that those embodiments are used herein simply as examples to set forth technical subjects of the present invention and that the present invention not be taken as being restricted to those examples. The true spirit and scope of the present invention should be defined simply by the description of the appended claims.

What is claimed is:

1. A semiconductor memory device, comprising
a plurality of memory cells arranged in a matrix manner on a semiconductor substrate, each memory cell having a respective source region, drain region, and channel region interposed between the source and drain regions; each source region shared by a pair of the memory cells adjacent to each other in a specified direction;
word lines formed along the memory cells disposed in a direction intersecting said specified direction to control them;
a field oxide film formed on said semiconductor substrate in a region between a the memory cells adjacent to each other in a direction along said word lines, for isolating elements from each other;
an insulating layer buried in the vicinity of an intermediate position between pair of said memory cells adjacent to each other in said direction along said word lines, extending to a level deeper than said field oxide films in said semiconductor substrate, said insulating layer being narrower than said field oxide film in said direction along said word lines,
bit lines connected to said drain regions of the memory cells disposed in a direction intersecting to said word lines; and
source lines commonly connecting the source regions of the memory cells disposed in said direction along said word lines;
said source regions being formed in said semiconductor substrate in regions between a respective pair of said word lines, the word lines of each pair being adjacent to each other;
said source lines being formed of conductive films patterned on said semiconductor substrate so as to connect the source regions of said memory cells disposed in said direction along said word lines.

2. A semiconductor memory device according to claim 1, wherein:
a groove, having a width narrower than said field oxide film, and extending to a level deeper than said field oxide film, is formed in said vicinity of said intermediate position in said field oxide film and said semiconductor substrate; and
said insulating layer is buried in said groove.

3. A semiconductor device according to claim 2, wherein said field oxide films are belt-shaped, the source regions of said memory cells are formed in self-alignment between adjacent ones of said field oxide films, the floating gates of the memory cells being formed in strips, said grooves formed in self-alignment between said strips.

4. A semiconductor memory device according to claim 1, wherein said field oxide film is belt-shaped in a region between said bit lines.

5. A semiconductor memory device according to claim 1, further comprising an insulating film for insulating said word lines and said source lines.

6. A semiconductor memory device according to claim 1, wherein gate assemblies each of which is a lamination of a tunnel insulating film for tunneling electric charge, a floating gate provided on said tunnel insulating layer for accumulating electric charge, an insulating film provided on said floating gate, and a control gate formed on said insulating film and acting as said word lines are provided on said channel regions.

7. A semiconductor memory device according to claim 1, wherein side walls of insulator are formed on sides of each of said word lines.

8. A semiconductor memory device according to claim 7, wherein said source lines are formed between said side walls provided on sides of the adjacent word lines.

* * * * *